(12) United States Patent
Saito

(10) Patent No.: US 7,579,693 B2
(45) Date of Patent: Aug. 25, 2009

(54) MOUNTING STRUCTURE OF BALL GRID ARRAY

(75) Inventor: Shoji Saito, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 507 days.

(21) Appl. No.: 11/099,088

(22) Filed: Apr. 5, 2005

(65) Prior Publication Data

US 2005/0218511 A1    Oct. 6, 2005

(30) Foreign Application Priority Data

Apr. 5, 2004    (JP)  .............................. 2004-110933

(51) Int. Cl.
*H01L 23/48* (2006.01)
*H05K 7/00* (2006.01)

(52) U.S. Cl. ........................ 257/773; 257/780; 257/782; 257/E23.021; 257/E23.069; 361/760; 361/764

(58) Field of Classification Search ........................ None
See application file for complete search history.

(56) References Cited

U.S. PATENT DOCUMENTS

| | | | | |
|---|---|---|---|---|
| 5,894,408 | A * | 4/1999 | Stark et al. | 361/704 |
| 5,930,115 | A * | 7/1999 | Tracy et al. | 361/704 |
| 5,949,238 | A * | 9/1999 | Marquis | 324/754 |
| 6,536,448 | B2 * | 3/2003 | McDevitt et al. | 132/321 |

FOREIGN PATENT DOCUMENTS

| | | |
|---|---|---|
| JP | 10-256693 | 9/1998 |
| JP | 11-163043 | 6/1999 |
| JP | 2000-58703 | 2/2000 |
| JP | 2001-326428 | 11/2001 |
| JP | 2002-217502 | 8/2002 |
| JP | 2003-46273 | 2/2003 |

OTHER PUBLICATIONS

Patent Abstracts of Japan, Publication No. 2000-058703, Publication Date Feb. 25, 2000, 1 page.
Patent Abstracts of Japan, Publication No. 11-163043, Publication Date Jun. 18, 1999, 1 page.
Patent Abstracts of Japan, Publication No. 10-256693, Publication Date Sep. 25, 1998, 1 page.
Japanese Office Action for Japanese Application 2004-110933 mailed on Feb. 5, 2007 (4 pages).

* cited by examiner

*Primary Examiner*—Alonzo Chambliss
(74) *Attorney, Agent, or Firm*—Osha • Liang LLP

(57) ABSTRACT

A ball grid array is mounted on a wiring board in a rectangular shape provided with screw insertion holes and fixed with screws to a mounting member at four points. Solder banks are formed around the screw insertion holes and pressed contact with a ground connecting face on the mounting member. The screw insertion holes are located in corners of an imaginary rectangular outline imagined on a board surface of the wiring board. Two of the holes diagonally positioned on the outline are located in one of corners and at an inward position of the wiring board, while the remaining two are located at intermediate parts of two sides embracing the corner. The wiring board is divided into a rectangular first zone surrounded by the four points and an L-shape second zone. The ball grid array is mounted on an intersecting area between vertical and transverse areas defining the L-shape.

9 Claims, 7 Drawing Sheets

MOUNTING STRUCTURE OF BALL GRID ARRAY

BACKGROUND OF THE INVENTION

1. Field of the Invention

The present invention relates to a mounting structure of a ball grid array, and more particularly, to the mounting structure of the ball grid array which can be favorably employed in case where a wiring board carrying the ball grid array is fixed with screws to a mounting member, such as a case body, at a plurality of points.

2. Description of the Related Art

The ball grid array (hereinafter referred to as the "BGA") is provided with terminals and solder balls which are arranged on its lower face. When the BGA is mounted on a wiring board, the solder balls will be melted thereby to connect the terminals to a conductor pattern on the wiring board. For this reason, there has been such anxiety that when an irregular warping has occurred in the wiring board on which the BGA had been mounted, the BGA will float up from the wiring board, and connecting points between the terminals and the aforesaid conductor pattern may be peeled off or broken. As reasons for causing the floating of the BGA due to the warping of the wiring board, a warping which has already occurred in the wiring board itself, and besides, an irregular distortion which may occur when the wiring board is fixed to the mounting member with small screws are considered. Although the former should be dealt with by enhancing manufacturing accuracy of the wiring board and so on, the latter cannot be necessarily dealt with by enhancing the manufacturing accuracy of the wiring board.

Such floating of the BGA from the wiring board attributed to the irregular distortion which occurs when the wiring board is fixed with the screws to the mounting member, such as a case body, will be described, referring to a conventional example which is shown in FIGS. 6A to 6C, 7, and 8.

FIG. 6A is a schematic plan view showing a conventional mounting structure of a ball grid array, FIG. 6B is a schematic view as seen in a direction of VIB in FIG. 6A, and FIG. 6C is a schematic view as seen in a direction of VIC in FIG. 6A. FIG. 7 is an enlarged view of an essential part of a wiring board 1 in FIGS. 6A to 6C, and FIG. 8 is an enlarged sectional view showing a point P where the wiring board 1 of FIGS. 6A to 6C is fixed to a mounting member 5, such as a case body, with a screw.

In the conventional mounting structure of the ball grid array, a BGA 2 is mounted in a center part or in a place close to the center part both in a vertical direction a and in a lateral direction b of the wiring board 1 which has, for example, a rectangular shape, as shown in FIG. 6A. Four screw insertion holes 12 for fixing the wiring board with screws are positioned in respective four corners of an imaginary rectangular outline L1 which is imagined on a board surface of the wiring board 1. Besides, an entirety of the wiring board 1 is divided into a first zone Z1 in a rectangular shape which is surrounded by all the screw insertion holes 12 positioned at the four points P to be fixed with the screws, and a second zone Z2 which is formed by an area S positioned at one side of the first zone Z1 in the lateral direction b. An entirety of mounting position of the BGA 2 is contained in the first zone Z1. On the other hand, as shown in FIGS. 6A to 6C or FIG. 7, on a back face of the wiring board 1, there are formed solder banks 13 as ground electrodes which are adapted to be pressure contacted with a ground connecting face (described below) provided on the mounting member 5 by fixing with screws at a plurality of positions around the respective screw insertion holes 12. As shown in FIG. 8, in a state where the wiring board 1 has been fixed to the mounting member 5, a fitting screw 14 which has been passed through the screw insertion hole 12 is screwed into a screw hole 51 of the mounting member 5, and at the same time, the aforesaid solder banks 13 as the ground electrodes are pressure contacted with a ground connecting face 52 which is provided on the mounting member 5 through tightening action of this fitting screw 14. Because of this pressure contact between the solder banks 13 and the ground connecting face 52, grounding stability of the wiring board 1 is enhanced. Although the mounting member 5 as shown in FIG. 8 is divided into an outer casing as a case body, and a chassis made of sheet metal to be grounded, it is also probable that this mounting member 5 may be formed only by the case body made of sheet metal.

In a state where the wiring board 1 has been fixed with the screws to the mounting member 5 at the four points in this manner, influence of tightening loads of the fitting screws 14 which have been applied to the four screwing points P will be exerted on the wiring board 1, and a warping may occur in the first zone Z1 of the wiring board which is defined by the four screwing points, even though the wiring board has been manufactured with high precision so as not to have a warping in itself. For this reason, such phenomenon that the wiring board 1 is irregularly distorted in the first zone Z1 in two directions perpendicular to each other, for example, may sometimes happen. When the wiring board 1 has an irregular warping in the first zone Z1 of the wiring board 1, there will occur floating of the BGA 2 mounted on the first zone Z1 from the wiring board 1. FIGS. 6B and 6C illustratively show the wiring board 1 in a state where the wiring board 1 has been irregularly distorted, and the warping has occurred in the two directions perpendicular to each other in the first zone Z1. When the above described floating of the BGA has occurred as shown in the drawings, there will be such anxiety that a gap is formed in a position A where the BGA 2 is overlapped on the wiring board 1, and the connecting points between the terminals of the BGA and the conductor pattern of the wiring board 1 may be peeled off or broken.

In case where the solder banks 13 as the ground electrodes are formed around the respective screw insertion holes 12 at the four points, as in the above described wiring board 1, the floating of the BGA 2 attributed to the irregular warping which has occurred in the first zone Z1 of the wiring board 1 will be more prominently promoted because of variations in height of the solder banks 13 or so.

However, it has been difficult to visually detect the floating with naked eyes, because a width of the warping in the wiring board 1 when it has been irregularly warped and a width of the floating of the BGA 2 when it has floated up from the wiring board 1 have been extremely small. As the results, there has been a problem that defective boards in which incomplete connection of the BGA has happened may occur.

On the other hand, an art of reinforcing the wiring board in order to restrain the wiring board from being warped has been heretofore proposed (Reference should be made to JP-A-2000-58703 and JP-A-11-163043). Moreover, an art of disposing hard glass bodies for the purpose of detecting that a warping has occurred in the wiring board, around the mounting position of the BGA on the wiring board has been also proposed (Reference should be made to JP-A-10-256693).

SUMMARY OF THE INVENTION

The invention has been made under the above described circumstances, and the invention provides a mounting structure of a ball grid array in which floating of the ball grid array from a wiring board can be restrained while an irregular warping of the wiring board is permitted, and occurrence of defective boards can be decreased, by appropriately arranging points on the wiring board to be fixed with screws, and selecting a layout of a mounting position for the ball grid array.

The invention also provides a mounting structure of a ball grid array in which floating of the ball grid array from the wiring board can be restrained and occurrence of defective boards can be decreased, even in case where a measure for enhancing grounding stability of the wiring board by pressure contacting solder banks as ground electrode of the wiring board with a ground connecting face of a mounting member at the screwing points has been taken.

Further, the invention provides a mounting structure of a ball grid array in which floating of the ball grid array from the wiring board can be restrained and occurrence of defective boards can be decreased, without increasing components and working steps in number as compared with the conventional mounting structure of the ball grid array.

According to the invention, there is provided a mounting structure of a ball grid array in which the ball grid array is mounted on a wiring board which is adapted to be fixed with screws to a mounting member, such as a case body, at a plurality of points, characterized in that an entirety of the wiring board is divided into a first zone which is surrounded by all of a plurality of the points to be fixed with the screws to the mounting member, and a second zone outside the first zone, and the ball grid array is mounted on the second zone.

As described in the beginning of the specification, floating of the BGA from the wiring board is attributed to a warping of the wiring board, and it has been found that the warping of the wiring board occurs because the tightening loads which have been applied to the screwing points of the wiring board are exerted on the wiring board. Therefore, in case where the entirety of the wiring board is divided into the first zone which is surrounded by all of a plurality of the points to be fixed with the screws to the mounting member, and the second zone outside the first zone, as in this invention, the irregular warping of the wiring board mainly occurs in the first zone which is likely to be affected by the tightening loads. On the other hand, the tightening loads will not be likely to affect the second zone, and therefore, influence by the warping which has occurred in the first zone will not appear in the second zone, or slightly appear, even though it may appear. For this reason, by mounting the BGA on the second zone, as in this invention, such phenomenon that the BGA may float up due to the warping of the wiring board will be restrained. This will prevent the connecting points between the terminals of the BGA and the conductor pattern of the wiring board from being peeled off or broken, and will contribute to decrease of occurrence of defective boards. This function will be prominently promoted by such a structure that relative position of the wiring board with respect to the mounting member is secured by fixing only the first zone out of the first zone and the second zone to the mounting member with the screws.

In this invention, it is possible to employ such a structure that the wiring board is fixed to the mounting member with the screws at the four points. According to this structure, the number of working steps when the wiring board is fixed to the mounting member with the screw will be substantially equal to the case of the conventional structure, as described referring to FIGS. 6A to 6C and 8, and the number of necessary components will not be increased.

In this invention, such a structure that solder banks as ground electrodes adapted to be pressure contacted with a ground connecting face which is provided on the mounting member are formed around respective screw insertion holes which are formed in the wiring board for fixing the wiring board with the screws may be employed.

Further, the mounting structure of the ball grid array according to the invention may be such that the entirety of the wiring board is divided into the first zone in a rectangular shape which is surrounded by all of the four points to be fixed to the mounting member with the screws, and the second zone which is defined by an area positioned at least at one side in a vertical direction or in a lateral direction of the first zone, and the ball grid array is mounted on an intermediate part in a longitudinal direction of the second zone or on an end part in the longitudinal direction of the second zone. It has been found that the latter case in which the BGA is mounted in the end part in the longitudinal direction of the second zone can more effectively restrain the floating of the BGA than the former case in which the BGA is mounted in the intermediate part in the longitudinal direction of the second zone. This will be further described herein below, referring to embodiments.

Further, the mounting structure of the ball grid array in this invention may be such that the entirety of the wiring board is divided into the first zone in a rectangular shape which is surrounded by all of the four points to be fixed to the mounting member with the screws, and the second zone which is defined by a vertical area positioned at least at one side in a lateral direction of the first zone and a transverse area positioned at least at one side in a vertical direction of the first zone, and the ball grid array is mounted on an intersecting area between the vertical area and the transverse area of the second zone. It has been found that this structure can restrain the floating of the BGA effectively. This will be further described also herein below, referring to the embodiments.

Still further, the mounting structure of the ball grid array may employ the following structure. Specifically, it is possible to employ the mounting structure of the ball grid array in which the ball grid array is mounted on a wiring board in a rectangular shape which is adapted to be fixed with screws to a mounting member, such as a case body, at four points, and provided with screw insertion holes for fixing the wiring board with the screws at the four points, and solder banks as ground electrodes adapted to be pressure contacted with a ground connecting face which is provided on the mounting member are respectively formed around the screw insertion holes, characterized in that the screw insertion holes at the four points are located in respective corners of an imaginary rectangular outline which is imagined on a board surface of the wiring board, and at the same time, two of the screw insertion holes diagonally positioned on the imaginary rectangular outline are respectively located in one of the corners of the wiring board and at an inward position of the wiring board, while the remaining two screw insertion holes are located at respective intermediate parts of two sides which embrace the corner of the wiring board, wherein the wiring board is divided into a first zone in a rectangular shape which is surrounded by all the four points to be fixed with the screws to the mounting member, and a second zone in an L-shape outside the first zone, and the ball grid array is mounted on an intersecting area between a vertical area and a transverse area which define the L-shape of the second zone. This invention too will be further described herein below, referring to the embodiments.

As described herein above, the mounting structure of the ball grid array according to the invention can be considered to be such a structure that the mounting position of the BGA on the wiring board is altered from the first zone where the entirety of the wiring board is likely to be warped due to the influence of the tightening loads at the screwing points to the second zone where such influence of the tightening loads is not likely to be exerted, and the warping is not likely to occur. As the results, such phenomenon that the BGA may float up due to the warping of the wiring board will be restrained. This will prevent the connecting points between the terminals of the BGA and the conductor pattern of the wiring board from being peeled off or broken, and occurrence of defective boards will be decreased. Moreover, this invention is different from the conventional mounting structure of the ball grid array only in that the mounting position of the BGA of the wiring board has been changed, and so, it is possible to enhance grounding stability of the wiring board by pressure contacting the solder banks as the ground electrode of the wiring board with the ground connecting face of the mounting member. At the same time, it is possible to obtain such advantage that there is no need of increasing the number of the components and working steps.

DETAILED DESCRIPTION OF THE INVENTION

Figure 1A:
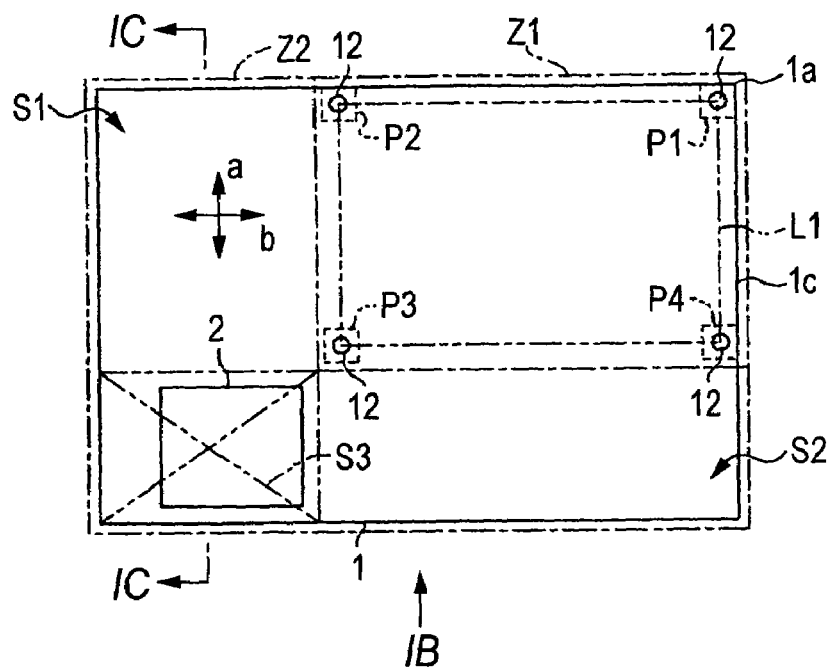
FIG. 1A is a schematic plan view showing a mounting structure of a ball grid array according to an embodiment of the invention.
Figure 1B:
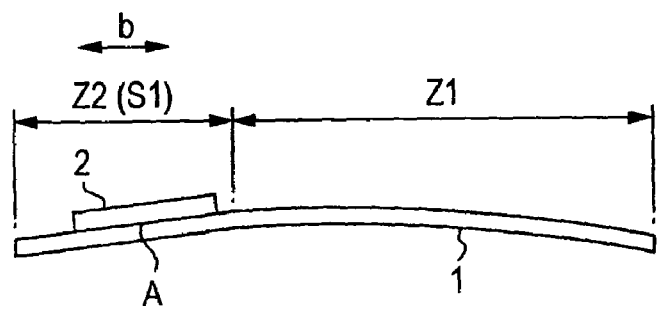
FIG. 1B is a schematic view as seen in a direction of IB in FIG. 1A.
Figure 1C:
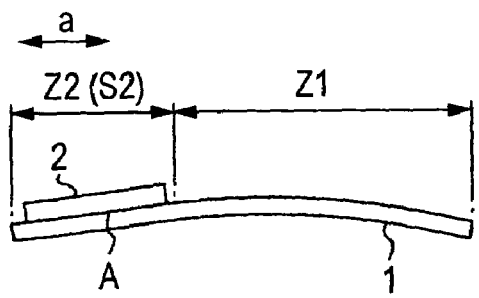
FIG. 1C is a schematic sectional view taken along a line IC-IC in FIG. 1A.

FIG. 1A is a schematic plan view showing a mounting structure of a ball grid array according to an embodiment of the invention, FIG. 1B is a schematic view as seen in a direction of IB in FIG. 1A, and FIG. 1C is a schematic sectional view taken along a line IC-IC in FIG. 1A.

Figure 6A:
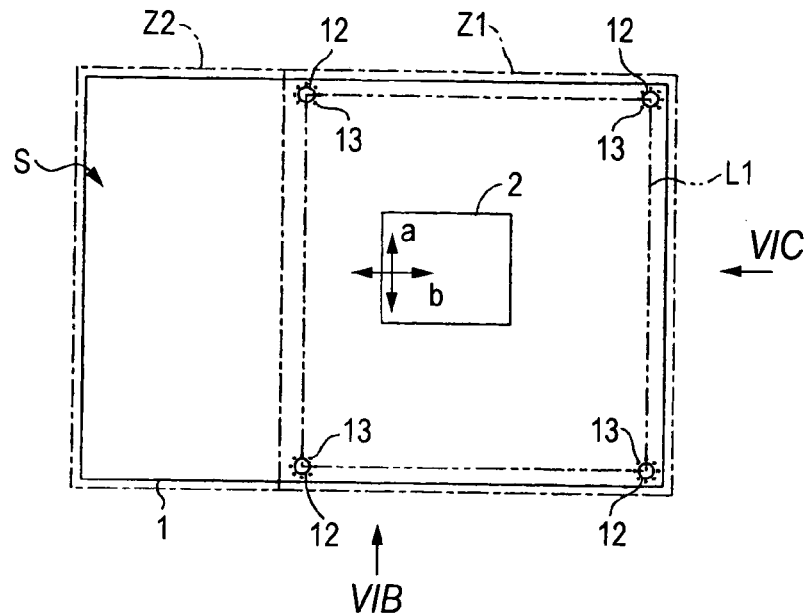
FIG. 6A is a schematic plan view showing a conventional mounting structure of a ball grid array.
Figure 6B:
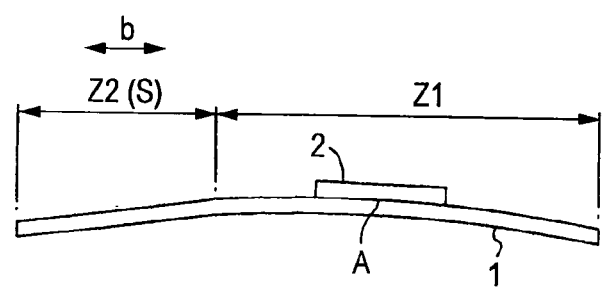
FIG. 6B is a schematic view as seen in a direction of VIB in FIG. 6A.
Figure 6C:
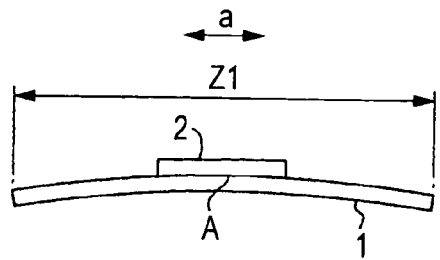
FIG. 6C is a schematic view as seen in a direction of VIC in FIG. 6A.
Figure 7:
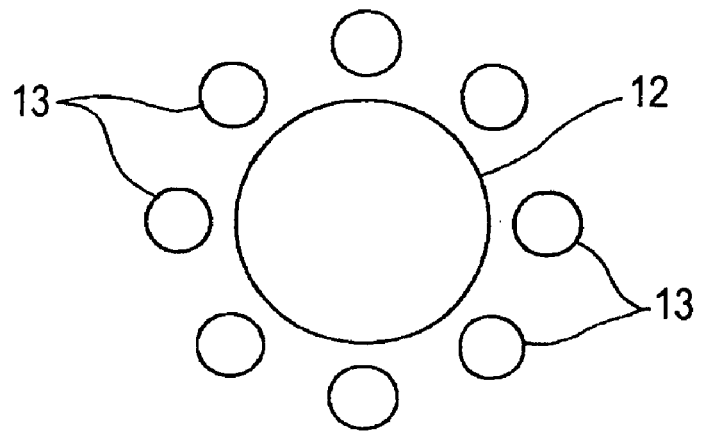
FIG. 7 is an enlarged view of an essential part of a wiring board in FIG. 6A.
Figure 8:
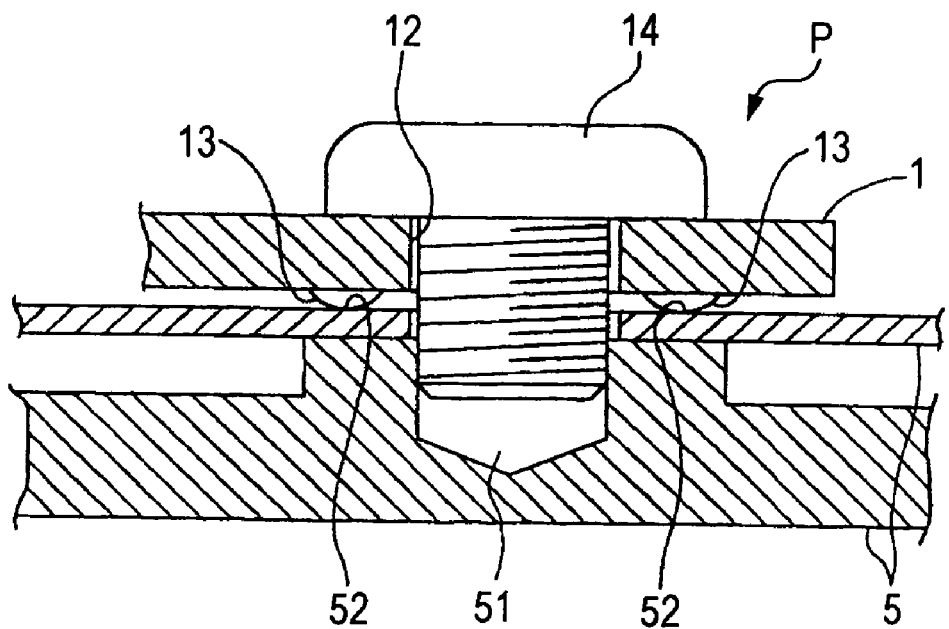
FIG. 8 is an enlarged sectional view showing a point where the wiring board of FIG. 6A is fixed with a screw.

In the mounting structure of the ball grid array in this embodiment, a wiring board 1 is in a rectangular shape. A BGA 2 is mounted on the wiring board 1, and screw insertion holes 12 for fixing with screws are formed at four points of the wiring board 1. On a back face of the wiring board 1 around each of the screw insertion holes 12, there are formed a plurality of solder banks (not shown. See FIG. 6A and FIG. 7) as ground electrodes which are adapted to be pressure contacted with a ground connecting face provided on a mounting member by fixing with screws. Relative position of the wiring board 1 with respect to the mounting member will be secured only by screwing fitting screws which have been passed through the screw insertion holes 12 at the four points contained in the first zone Z1, into screw holes in the mounting member, and tightening them (See FIG. 8). In other words, only the first zone Z1 of the wiring board 1 is secured to the mounting member by fixing with the screws, while the second zone Z2 is not secured to the mounting member.

In this embodiment, the screw insertion holes 12 at the four points are positioned in the respective corners of the imaginary rectangular outline L1 which is imagined on a board surface of the wiring board. At the same time, the two screw insertion holes 12, 12 diagonally positioned on the imaginary rectangular outline L1 are respectively positioned in one corner 1a of the wiring board 1 and at an inward position of the wiring board 1, while the remaining two screw insertion holes 12, 12 are positioned at respective intermediate positions of two sides 1b, 1c which embrace the aforesaid corner 1a. Moreover, an entirety of the wiring board 1 is divided into a first zone Z1 in a rectangular shape which is surrounded by all the four points P1 to P4 where the wiring board is fixed with the screws, and a second zone Z2 in an L-shape outside the first zone Z1. The BGA 2 is mounted on an area S3 where a vertical area S1 and a transverse area S2 forming the L-shape of the second zone Z2 intersect with each other.

In this mounting structure of the ball grid array, in case where the screwing points P1 to P4 at the four positions of the wiring board 1 have been fixed with the screws to the mounting member (not shown. See FIG. 8), an irregular warping of the wiring board 1 mainly occurs in the first zone Z1 which is likely to be affected by tightening loads caused by fixing with the screws. On the other hand, the tightening loads will not affect the second zone Z2, and therefore, influence by the warping which has occurred in the first zone Z1 will not appear in the second zone Z2, or slightly appear, even though it may appear. This is illustratively explained in FIGS. 1B and 1C. As shown in the drawings, in the vertical area S1 of the second zone Z2, although a slight warping in a vertical direction a appears, almost no warping occurs in a lateral direction b (FIG. 1B). On the contrary, in the transverse area S2 of the second zone Z2, although almost no warping in the lateral direction a appears (FIG. 1C), a slight warping in the lateral direction b appears. Within respective ranges of the vertical area S1 and the transverse area S2 of the second zone Z2, influence of the warping which has occurred in the first zone Z1 remarkably appears in some places, but hardly appears in the other places, depending on their locations. The place where the influence of the warping which has occurred in the first zone Z1 hardly appears corresponds to the area S3 where the vertical area S1 and the transverse area S2 intersect with each other, and this area S3 is considered to be substantially flat. Accordingly, by mounting the BGA 2 in this intersecting area S3 as in this embodiment, floating of the BGA 2 from the wiring board 1 will not occur, or a floating width will be so small as to be neglected, even though the floating may occur. For this reason, such phenomenon that a gap is formed in the overlapped part A between the wiring board 1 and the BGA 2 will not be likely to happen, and there will be no anxiety that the connecting points between the terminals of the BGA 2 and the conductor pattern of the wiring board 1 may be peeled off or broken. As the results, defective boards due to the floating of the BGA 2 will not be likely to happen.

Figure 2:
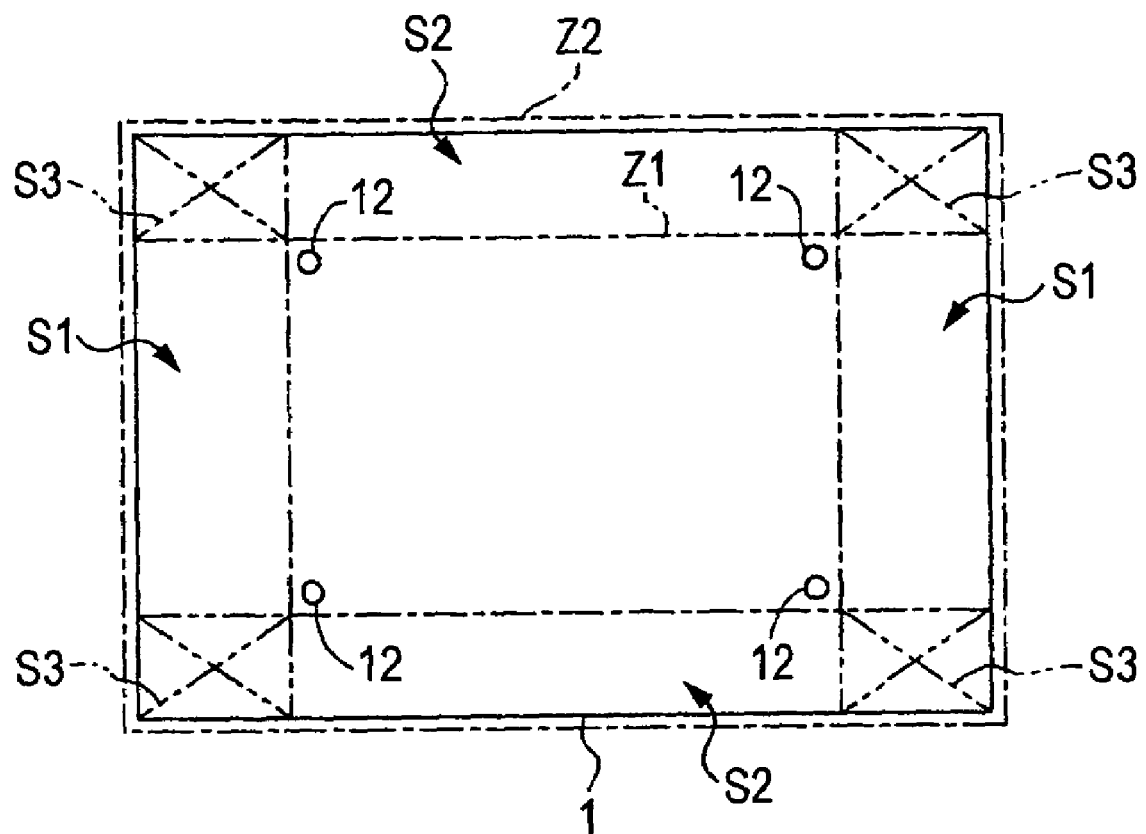
FIG. 2 is a plan view illustratively showing a modified example of the mounting structure of the ball grid array in FIG. 1A.

FIG. 2 is a plan view illustratively showing a modified example of the mounting structure of the ball grid array in FIG. 1A. In this example, the first zone Z1 is defined in a center part of the wiring board 1, and the second zone Z2 is defined so as to surround the first zone Z1. In the wiring board 1 having such arrangement, the vertical areas S1 are located at both sides in a lateral direction of the first zone Z1, and the transverse areas S2 are located at both sides in a vertical direction of the first zone Z1. Accordingly, there are formed the intersecting areas S3 respectively in the four corners of the wiring board 1 in a rectangular shape. By appropriately selecting either of these intersecting areas S3 and mounting the BGA (not shown) thereon, the mounting structure of the ball grid array in which floating of the BGA is not likely to occur can be obtained. Other features are substantially the same as those described in FIGS. 1A to 1C.

Figure 3A:
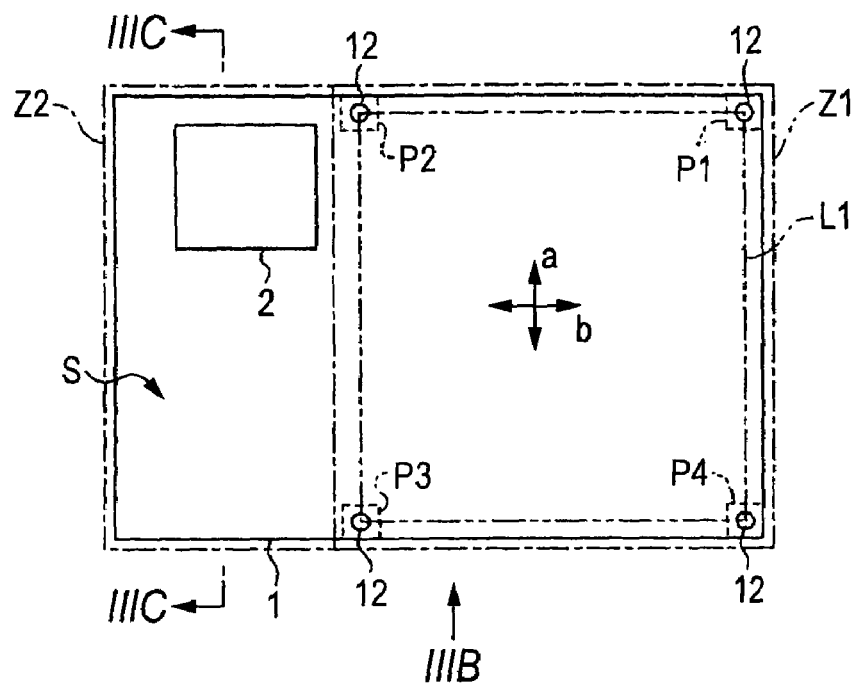
FIG. 3A is a schematic plan view showing a mounting structure of a ball grid array according to another embodiment of the invention.
Figure 3B:
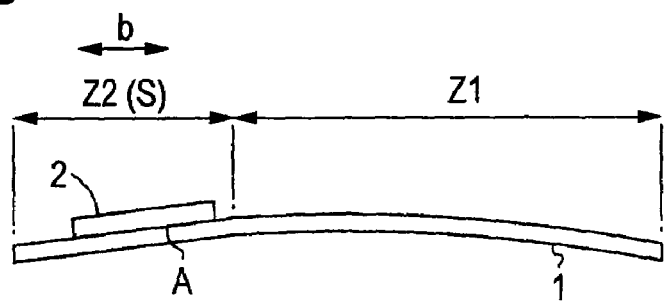
FIG. 3B is a schematic view as seen in a direction of IIIB in FIG. 3A.
Figure 3C:
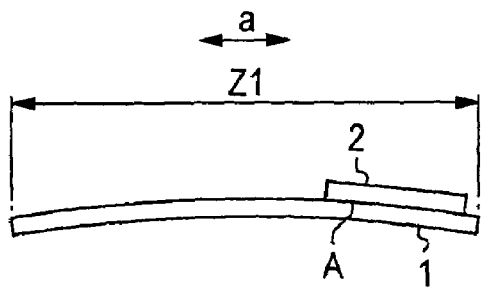
FIG. 3C is a schematic sectional view taken along a line IIIC-IIIC in FIG. 3A.
Figure 4A:
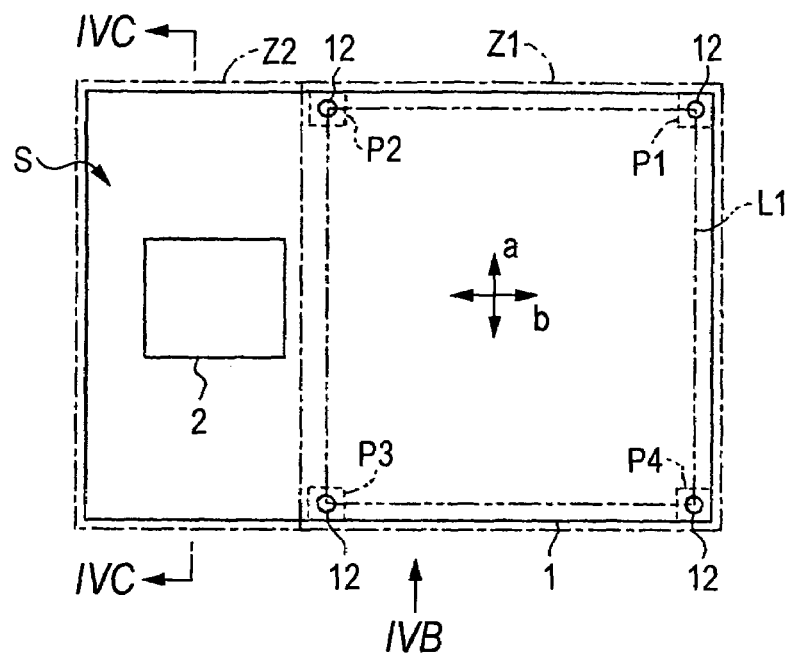
FIG. 4A is a schematic plan view showing a mounting structure of a ball grid array according to still another embodiment of the invention.
Figure 4B:
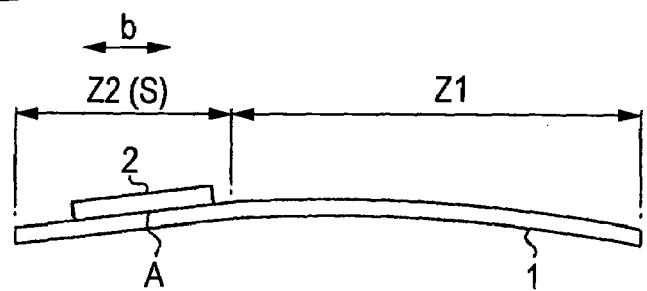
FIG. 4B is a schematic view as seen in a direction of IVB in FIG. 4A.
Figure 4C:
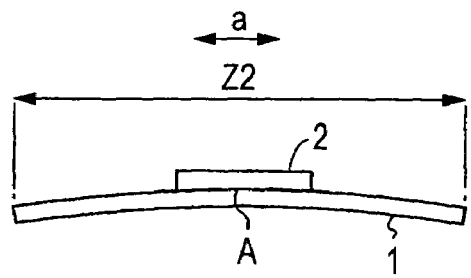
FIG. 4C is a schematic sectional view taken along a line IVC-IVC in FIG. 4A.
Figure 5:
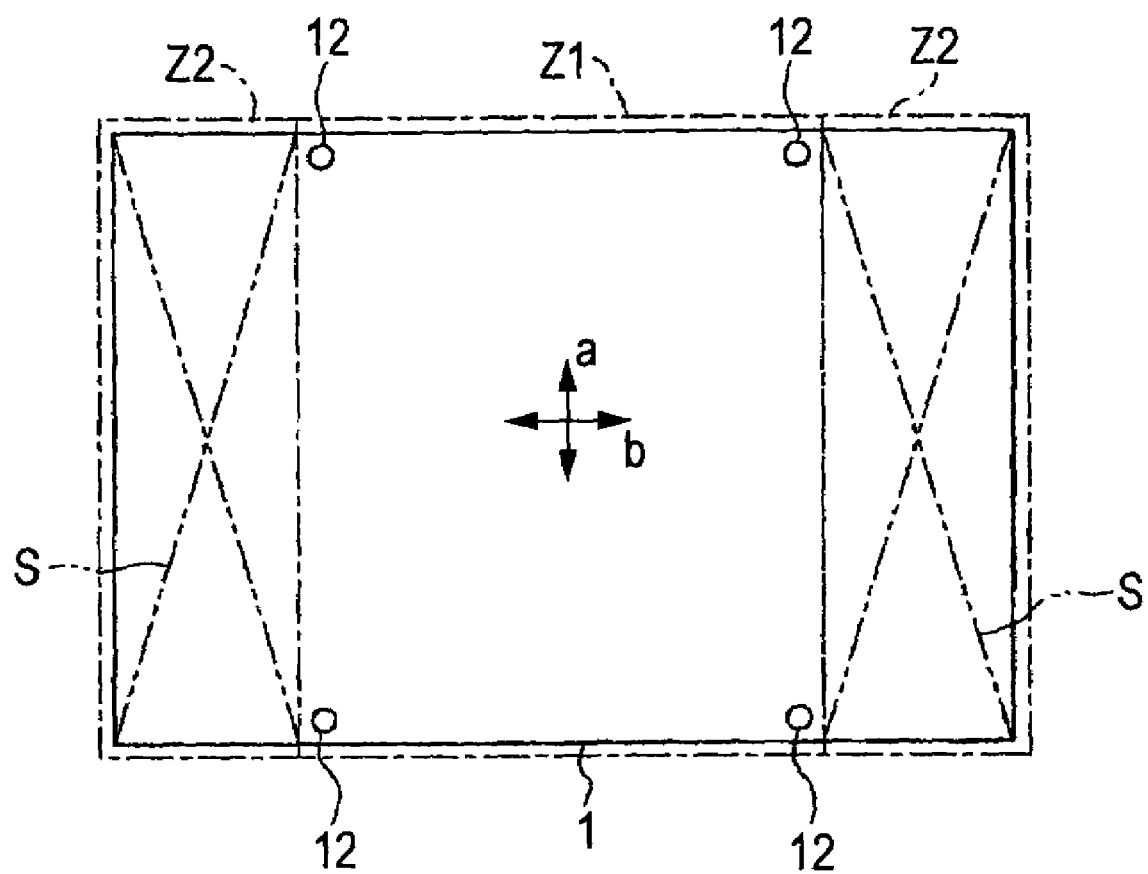
FIG. 5 is a schematic plan view showing a mounting structure of a ball grid array according to a further modification of the invention.

FIG. 3A is a schematic plan view showing a mounting structure of a ball grid array according to another embodiment of the invention, FIG. 3B is a schematic view as seen in a direction of IIIB in FIG. 3A, and FIG. 3C is a schematic sectional view taken along a line IIIC-IIIC in FIG. 3A. FIG. 4A is a schematic plan view showing a mounting structure of a ball grid array according to still another embodiment of the invention, FIG. 4B is a schematic view as seen in a direction of IVB in FIG. 4A, and FIG. 4C is a schematic sectional view taken along a line IVC-IVC in FIG. 4A. FIG. 5 is a schematic plan view showing a mounting structure of a ball grid array according to a further modification of the invention.

In the embodiment as shown in FIGS. 3A to 3C, the entirety of the wiring board 1 in a rectangular shape is divided into the first zone Z1 in a rectangular shape which is surrounded by all the four points P1 to P4 to be fixed with screws to the mounting member, and the second zone Z2 which is formed by an area S (corresponding to the vertical area) positioned at one side in a lateral direction of the first zone Z1. The BGA 2 is mounted in an end part in a longitudinal direction (an end part in the vertical direction) of the second zone Z2. In this structure too, in case where the four screwing points P1 to P4 of the wiring board 1 have been fixed with the screws to the mounting member, an irregular warping of the wiring board 1 mainly occurs in the first zone Z1 which is likely to be affected by tightening loads on occasion of fixing with the screws. On the other hand, the tightening loads will not be likely to affect the second zone Z2, and therefore, influence of the warping which has occurred in the first zone Z1 will not appear in the second zone Z2, or slightly appear, even though it may appear. This is illustratively explained in FIGS. 3B and 3C. Within a range of the area S of the second zone Z2, the influence of the warping which has occurred in the first zone Z1 remarkably appears in some places, but hardly appears in the other places, depending on their locations. The place where the influence of the warping which has occurred in the first zone Z1 hardly appears corresponds to an end part in the longitudinal direction of the area S, and this area S is considered to have a shape extremely close to flat. Accordingly, by mounting the BGA 2 in this end part in the longitudinal direction as in this embodiment, floating of the BGA 2 from the wiring board 1 will not be likely to occur. For this reason, such phenomenon that a gap is formed in the overlapped part A between the wiring board 1 and the BGA 2 will not be likely to happen, and there will be no anxiety that the connecting points between the terminals of the BGA 2 and the conductor pattern of the wiring board 1 may be peeled off or broken. As the results, defective boards due to the floating of the BGA 2 will not be likely to happen.

On the other hand, in the embodiment as shown in FIGS. 4A to 4C, a place where the BGA 2 is to be mounted is determined at an intermediate part in the longitudinal direction (an intermediate part in the vertical direction) of the second zone Z2. Although the intermediate part in the longitudinal direction of the second zone Z2 is such a place that influence of the irregular warping which has occurred in the first zone Z1 is likely to appear in a form of warping in the vertical direction a, degree of the warping is very small. By mounting the BGA 2 in the intermediate part in the longitudinal direction as in this embodiment, such phenomenon that a gap is formed in the overlapped part A between the wiring board 1 and the BGA 2 will not be likely to happen, and there will be no anxiety that the connecting points between the terminals of the BGA 2 and the conductor pattern of the wiring board 1 may be peeled off or broken. As the results, defective boards due to the floating of the BGA 2 will not be likely to happen.

In FIGS. 3A to 3C and FIGS. 4A to 4C, the entirety of the wiring board 1 in a rectangular shape is divided into the first zone Z1 and the second zone Z2 which is formed by the area S positioned at one side in the lateral direction of the first zone Z1. However, it is also possible to define the second zones Z2 at both sides in the lateral direction of the first zone Z1, as shown in FIG. 5, and to select either of the second zones Z2 as the mounting position of the BGA, for the purpose of mounting the BGA in the intermediate part or in the end part in the longitudinal direction of the area S which forms the relevant second zone Z2.

Moreover, although not shown, it is also possible to divide the entirety of the wiring board 1 in a rectangular shape into a first zone in a rectangular shape, and a second zone which is formed by an area positioned at one side or at both sides in a vertical direction of the first zone, and to mount the BGA in an intermediate part or in an end part in a longitudinal direction (a lateral direction) of the second zone.

In the respective embodiments as described herein above, the wiring board 1 is in a rectangular shape. However, the shape of the wiring board 1 is not limited to the rectangular shape. Moreover, the number of the points to be fixed with screws is not limited to four, but may be three or more than four.

What is claimed is:

1. A mounting structure of a ball grid array which is mounted on a wiring board in a rectangular shape adapted to be fixed with screws to a mounting member, such as a case body, at four points, wherein the wiring board is provided with screw insertion holes for fixing the wiring board with the screws at the four points, solder banks as ground electrodes are formed around the screw insertion holes and are adapted to be pressure contacted with a ground connecting face which is provided on the mounting member by fixing with the screws, the screw insertion holes at the four points are located in respective corners of an imaginary rectangular outline which is imagined on a board surface of the wiring board, and two of the screw insertion holes diagonally positioned on the imaginary rectangular outline are respectively located in one of corners of the wiring board and at an inward position of the wiring board, while the remaining two screw insertion holes are located at respective intermediate parts of two sides which embrace the corner of the wiring board, the wiring board is divided into a first zone in a rectangular shape which is surrounded by all the four points to be fixed with screws to the mounting member and a second zone in an L-shape outside the first zone, and the ball grid array is mounted on an intersecting area between a vertical area and a transverse area which define the L-shape of the second zone.

2. A mounting structure of a ball grid array which is mounted on a wiring board adapted to be fixed with screws to a mounting member, such as a case body, at a plurality of points, wherein
   an entirety of the wiring board is divided into a first zone surrounded by all of the plurality of points to be fixed with the screws to the mounting member and a second zone outside the first zone, and
   the ball grid array is mounted on the second zone.

3. The mounting structure of a ball grid array as claimed in claim 2, wherein
   a relative position of the wiring board with respect to the mounting member is secured by fixing only the first zone out of the first zone and the second zone to the mounting member with the screws.

4. The mounting structure of a ball grid array as claimed in claim 2, wherein
   the wiring board is fixed to the mounting member with the screws at four points.

5. The mounting structure of a ball grid array as claimed in claim 4, wherein
   the entirety of the wiring board is divided into the first zone in a rectangular shape which is surrounded by all of the four points to be fixed to the mounting member with the screws, and the second zone which is defined by an area positioned at least at one side in a vertical direction or in a lateral direction of the first zone, and
   the ball grid array is mounted on an intermediate part in a longitudinal direction of the second zone.

6. The mounting structure of a ball grid array as claimed in claim 4, wherein
   the entirety of the wiring board is divided into the first zone in a rectangular shape which is surrounded by all of the four points to be fixed to the mounting member with the screws, and the second zone which is defined by an area positioned at least at one side in a vertical direction or in a lateral direction of the first zone, and
   the ball grid array is mounted on an end part in a longitudinal direction of the second zone.

7. The mounting structure of a ball grid array as claimed in claim 4, wherein
   the entirety of the wiring board is divided into the first zone in a rectangular shape which is surrounded by all of the four points to be fixed to the mounting member with the screws, and the second zone which is defined by a vertical area positioned at least at one side in a lateral direction of the first zone and a transverse area positioned at least at one side in a vertical direction of the first zone, and
   the ball grid array is mounted on an intersecting area between the vertical area and the transverse area of the second zone.

8. The mounting structure of a ball grid array as claimed in claim 2, wherein
   solder banks as ground electrodes are formed around screw insertion holes which are formed in the wiring board for fixing the wiring board with the screws and are adapted to be pressure contacted with a ground connecting face which is provided on the mounting member by fixing with the screws.

9. A mounting method of a ball grid array which is mounted on a wiring board in a rectangular shape adapted to be fixed with screws to a mounting member, such as a case body, at four points, the method comprising:
   providing the wiring board with screw insertion holes for fixing the wiring board with the screws at the four points;
   forming solder banks as ground electrodes around the screw insertion holes, and adapted the solder banks pressure contacted with a ground connecting face which is provided on the mounting member by fixing with the screws;
   locating the screw insertion holes at the four points in respective corners of an imaginary rectangular outline which is imagined on a board surface of the wiring board, and locating two of the screw insertion holes diagonally positioned on the imaginary rectangular outline in one of corners of the wiring board and at an inward position of the wiring board, while locating the remaining two screw insertion holes at respective intermediate parts of two sides which embrace the corner of the wiring board;
   dividing the wiring board into a first zone in a rectangular shape which is surrounded by all the four points to be fixed with screws to the mounting member and a second zone in an L-shape outside the first zone; and
   mounting the ball grid array on an intersecting area between a vertical area and a transverse area which define the L-shape of the second zone.

* * * * *